(12) United States Patent
Yeh et al.

(10) Patent No.: US 10,923,608 B2
(45) Date of Patent: Feb. 16, 2021

(54) CONDUCTIVE PASTE FOR SOLAR CELL, SOLAR CELL AND MANUFACTURING METHOD THEREOF, AND SOLAR CELL MODULE

(71) Applicant: GIGA SOLAR MATERIALS CORP., Hsinchu (TW)

(72) Inventors: Chih-Hsien Yeh, Hsinchu (TW); Pi-Yu Hsin, Hsinchu (TW); Chung-Chieh Cheng, Hsinchu (TW); Yu-Shuo Yang, Hsinchu (TW)

(73) Assignee: GIGA SOLAR MATERIALS CORP., Hsinchu (TW)

( * ) Notice: Subject to any disclaimer, the term of this patent is extended or adjusted under 35 U.S.C. 154(b) by 113 days.

(21) Appl. No.: 15/940,976

(22) Filed: Mar. 30, 2018

(65) Prior Publication Data
US 2018/0315868 A1 Nov. 1, 2018

(30) Foreign Application Priority Data
Apr. 28, 2017 (TW) .............................. 106114170 A

(51) Int. Cl.
*H01L 31/00* (2006.01)
*H01B 1/16* (2006.01)
(Continued)

(52) U.S. Cl.
CPC ........ *H01L 31/022425* (2013.01); *C03C 4/14* (2013.01); *C03C 8/02* (2013.01); *C03C 8/04* (2013.01); *C03C 8/10* (2013.01); *C03C 8/18* (2013.01); *H01B 1/16* (2013.01); *H01B 1/22* (2013.01); *H01L 31/022466* (2013.01); *H01L 31/1884* (2013.01); *C03C 2204/00* (2013.01); *C03C 2205/00* (2013.01); *Y02E 10/50* (2013.01)

(58) Field of Classification Search
CPC .... H01B 1/00; H01B 1/16; C03C 3/00; C03C 4/14; C03C 12/00; C09D 5/24; H01L 31/0224
See application file for complete search history.

(56) References Cited

U.S. PATENT DOCUMENTS 5,183,784 A * 2/1993 Nguyen .................... C03C 8/18
106/1.14
9,209,323 B2 12/2015 Hayashi et al.
(Continued)

FOREIGN PATENT DOCUMENTS

| CN | 103578603 | 2/2014 |
| CN | 103596648 | 2/2014 |

(Continued)

OTHER PUBLICATIONS

"Office Action of Japan Counterpart Application", dated May 28, 2019, p. 1-p. 4, (No English language translation provided).
(Continued)

*Primary Examiner* — Mark Kopec
(74) *Attorney, Agent, or Firm* — JCIPRNET

(57) ABSTRACT

A conductive paste for a solar cell, a solar cell and a manufacturing method thereof, and a solar cell module are provided. The conductive paste for a solar cell includes a silver powder, a glass, an organic vehicle, and a tellurium alloy compound, wherein the tellurium alloy compound has a melting point at least 300° C. higher than the softening point of the glass.

6 Claims, 2 Drawing Sheets

(51) Int. Cl.
  *H01L 31/0224* (2006.01)
  *H01L 31/18* (2006.01)
  *C03C 4/14* (2006.01)
  *C03C 8/04* (2006.01)
  *C03C 8/10* (2006.01)
  *C03C 8/02* (2006.01)
  *C03C 8/18* (2006.01)
  *H01B 1/22* (2006.01)

(56) References Cited

U.S. PATENT DOCUMENTS

| | | | |
|---|---|---|---|
| 2011/0192457 A1* | 8/2011 | Nakayama | H01B 1/22 |
| | | | 136/256 |
| 2014/0021417 A1 | 1/2014 | Koike et al. | |
| 2014/0290735 A1 | 10/2014 | Park et al. | |
| 2015/0159025 A1* | 6/2015 | Takagi | C09D 5/24 |
| | | | 257/746 |
| 2015/0318419 A1 | 11/2015 | Hayashi et al. | |
| 2016/0190360 A1 | 6/2016 | Jung et al. | |

FOREIGN PATENT DOCUMENTS

| | | | |
|---|---|---|---|
| CN | 104575669 | | 4/2015 |
| CN | 105280731 | | 1/2016 |
| JP | 2002141520 | | 5/2002 |
| JP | 2013534023 | | 8/2013 |
| JP | 2014207312 | | 10/2014 |
| JP | 2016110973 | | 6/2016 |
| JP | 2017010628 | | 1/2017 |
| KR | 2014017052 | A * | 2/2014 |
| KR | 20140017052 | | 2/2014 |
| KR | 101452966 | | 10/2014 |
| TW | 201407640 | | 2/2014 |
| TW | I485866 | | 5/2015 |
| TW | 201526027 | | 7/2015 |
| TW | 201529513 | | 8/2015 |
| WO | 2010016186 | | 2/2010 |
| WO | 2015163570 | | 10/2015 |
| WO | 2017100516 | | 6/2017 |
| WO | 2017125710 | | 7/2017 |

OTHER PUBLICATIONS

"Search Report of Europe Counterpart Application", dated Aug. 1, 2018, p. 1-p. 7.

* cited by examiner

US 10,923,608 B2

CONDUCTIVE PASTE FOR SOLAR CELL, SOLAR CELL AND MANUFACTURING METHOD THEREOF, AND SOLAR CELL MODULE

CROSS-REFERENCE TO RELATED APPLICATION

This application claims the priority benefit of Taiwan application serial no. 106114170, filed on Apr. 28, 2017. The entirety of the above-mentioned patent application is hereby incorporated by reference herein and made a part of this specification.

BACKGROUND OF THE INVENTION

Field of the Invention

The invention relates to a conductive paste for a solar cell, a solar cell and a manufacturing method thereof, and a solar cell module, and more particularly, to a conductive paste for a solar cell, a solar cell and a manufacturing method thereof, and a solar cell module that can improve electrical connection and increase cell efficiency.

Description of Related Art

The solar cell is a device converting sunlight into electric energy that generates electrons and electron holes via the irradiation of visible light on a substrate, and the electrons and electron holes are guided by a front electrode (light-receiving surface) and a back electrode (non-light-receiving surface) located at two sides of the substrate to form a current. These two electrodes can be formed by adhering a conductive paste on the substrate using a screen printing or coating method and then performing sintering in a specific temperature range.

In the manufacturing process of a solar cell, the main material is the conductive paste, and the components, amounts, and sintering conditions of the conductive paste all may affect the electrical performance of the solar cell after the paste is sintered. More specifically, when molten glass is excessively fired through, cell efficiency may be reduced.

Based on the above, the development of a front electrode silver paste that can inhibit glass fire-through to control the degree of fire-through so as to improve electrical connection of the solar cell and increase cell efficiency is an important topic requiring research.

SUMMARY OF THE INVENTION

The invention provides a conductive paste for a solar cell containing a high-melting point tellurium alloy compound that can inhibit glass fire-through to control the degree of fire-through, so as to improve electrical connection and increase cell efficiency. At the same time, the invention provides a solar cell and a manufacturing method thereof and a solar cell module.

The conductive paste for a solar cell of the invention includes a silver powder, a glass, an organic vehicle, and a tellurium alloy compound, wherein the tellurium alloy compound has a melting point at least 300° C. higher than the softening point of the glass.

In an embodiment of the invention, the melting point of the tellurium alloy compound is 900° C. or more.

In an embodiment of the invention, the tellurium alloy compound includes lead telluride, zinc telluride, silver telluride, or a combination thereof.

In an embodiment of the invention, the material of the glass includes tellurium oxide, bismuth oxide, zinc oxide, lead oxide, silicon oxide, or a combination thereof.

In an embodiment of the invention, based on the total weight of the conductive paste for a solar cell, the amount of the glass is 0.01 wt % to 7 wt %, and the amount of the tellurium alloy compound is 0.01 wt % to 5 wt %.

In an embodiment of the invention, the material of the glass includes tellurium oxide, bismuth oxide, and zinc oxide, and based on the total weight of the conductive paste for a solar cell, the amount of the tellurium alloy compound is 0.01 wt % to 3.5 wt %.

In an embodiment of the invention, the material of the glass includes lead oxide and tellurium oxide, and based on the total weight of the conductive paste for a solar cell, the amount of the tellurium alloy compound is 0.25 wt % to 4 wt %.

In an embodiment of the invention, the material of the glass includes tellurium oxide, bismuth oxide, and silicon oxide, and based on the total weight of the conductive paste for a solar cell, the amount of the tellurium alloy compound is 0.25 wt % to 3.5 wt %.

In an embodiment of the invention, the material of the glass includes lead oxide and bismuth oxide, and based on the total weight of the conductive paste for a solar cell, the amount of the tellurium alloy compound is 0.5 wt % to 3 wt %.

The solar cell of the invention includes an electrode made by the aforementioned conductive paste for a solar cell.

The manufacturing method of a solar cell of the invention forms an electrode for a solar cell using the aforementioned conductive paste for a solar cell.

The solar cell module of the invention includes the aforementioned solar cell or a solar cell made by the aforementioned manufacturing method of a solar cell.

Based on the above, the conductive paste for a solar cell of the invention contains a high-melting point tellurium alloy compound having a melting point (such as 900° C. or more) at least 300° C. higher than the softening point of glass. Therefore, the fire-through of the glass can be inhibited to control the degree of fire-through so as to improve electrical connection and increase cell efficiency. As a result, the issue of reduced cell efficiency caused by glass firing through the PN junction in the prior art can be solved.

In order to make the aforementioned features and advantages of the invention more comprehensible, embodiments are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention provides a conductive paste for a solar cell that can be used to form a positive electrode of a solar cell.

More specifically, the conductive paste for a solar cell of the invention can include a silver powder, a glass, an organic vehicle, and a high-melting point tellurium alloy compound. Hereinafter, each component in the conductive paste for a solar cell of the invention is described in detail.

<Tellurium Alloy Compound>

In the present embodiment, the high-melting point tellurium alloy compound can have a melting point at least 300° C. higher than the softening point of glass, and the melting point thereof is 900° C. or more, for instance. The softening point of the glass of the invention is, for instance, 317° C. to 465° C., and the tellurium alloy compound can have a melting point at least 300° C. higher than the softening point of the glass, and therefore the melting point of the tellurium alloy compound is, for instance, higher than 617° C. to 765° C. More specifically, the tellurium alloy compound preferably can include lead telluride, zinc telluride, silver telluride, or a combination thereof, wherein the melting point of lead telluride is about 924° C., the melting point of silver telluride is about 955° C., and the melting point of zinc telluride is about 1238° C. However, the invention is not limited thereto, and other tellurium alloy compounds having a melting point of, for instance, 900° C. or more can also be used, such as copper telluride, manganese telluride, cadmium telluride, or iron telluride, wherein the melting point of copper telluride is about 1125° C., the melting point of manganese telluride is about 1150° C., the melting point of cadmium telluride is about 1090° C., and the melting point of iron telluride is about 914° C.

Figure 1:
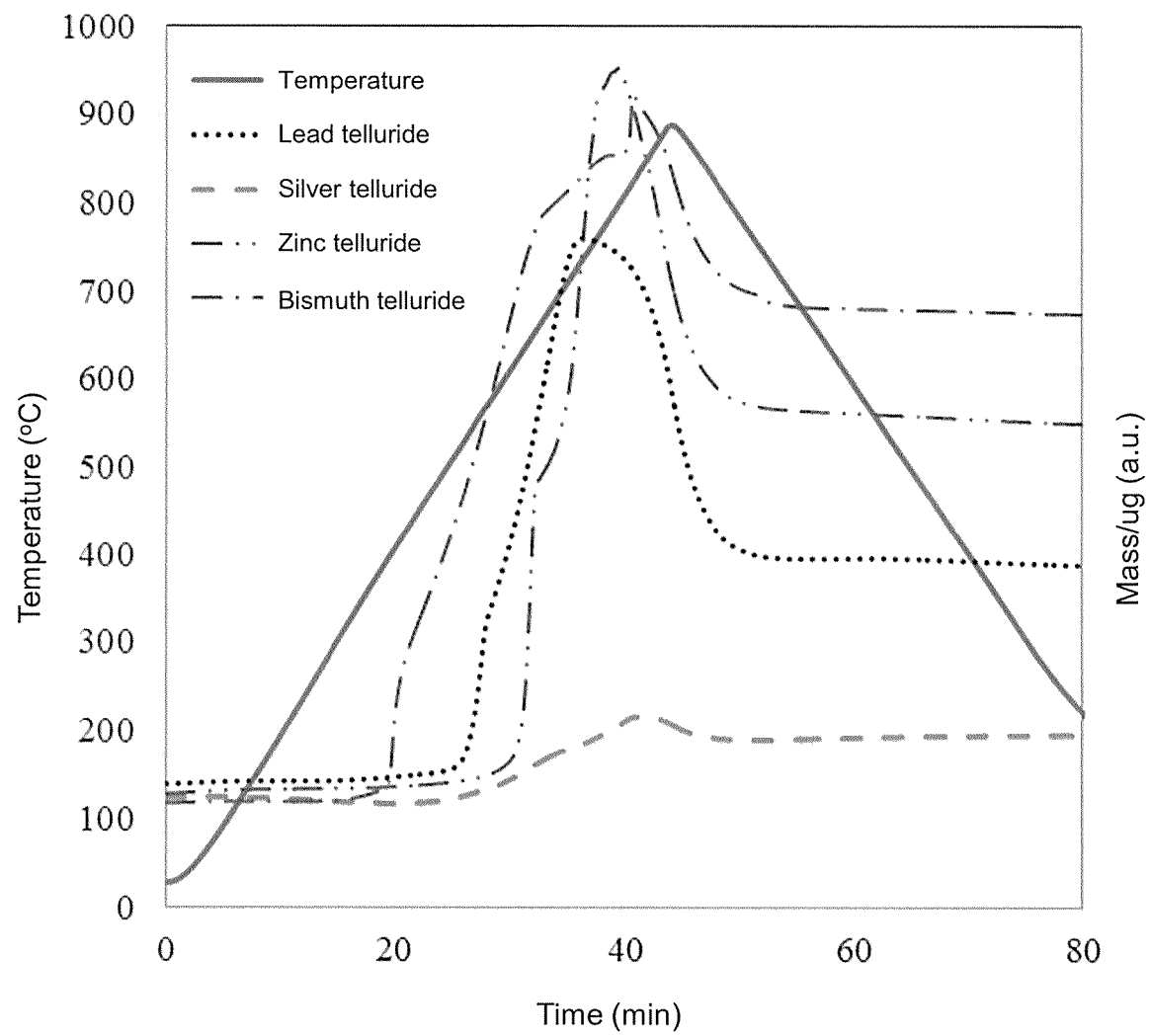
FIG. 1 is the TGA analysis result of a tellurium alloy compound.
Figure 2:
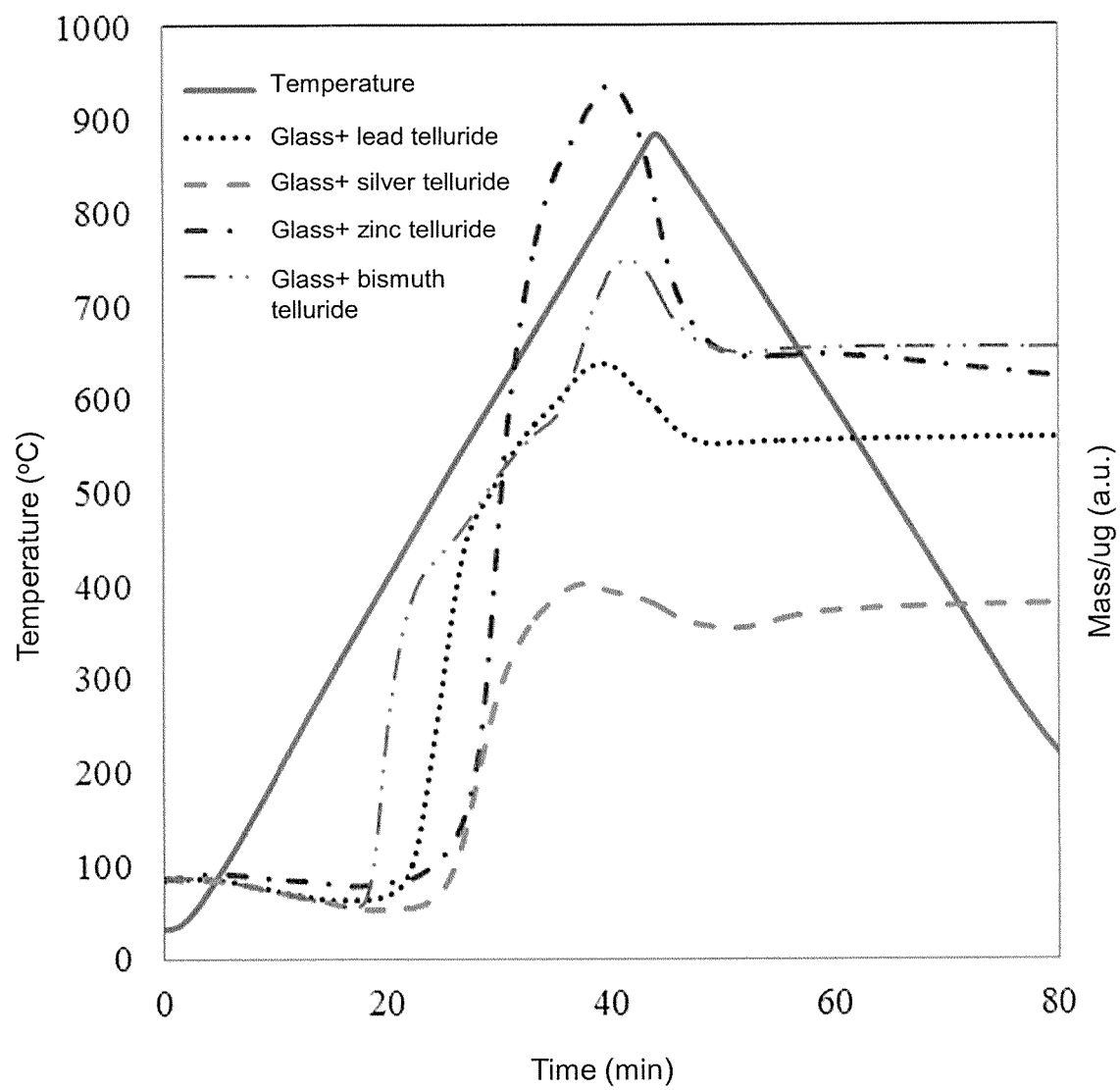
FIG. 2 is the TGA analysis result of a mixture of a tellurium alloy compound and a glass.

FIG. 1 is the thermogravimetric analysis (TGA) result of a tellurium alloy compound. FIG. 2 is the TGA analysis result of a mixture of a tellurium alloy compound and a glass. When temperature rise in TGA is controlled, the occurrence of material oxidization can be speculated from the material weight gain rate curve, especially when the material weight gain rate is increased rapidly.

As shown in FIG. 1, among the four kinds of tellurium alloy compounds of bismuth telluride, lead telluride, zinc telluride, and silver telluride, the weight gain rate curve shows bismuth telluride rapidly increases in weight at low temperature, followed by lead telluride, zinc telluride, and silver telluride in that order. Therefore, it can be known that, in comparison to lead telluride, zinc telluride, and silver telluride having a high-melting point, it is easier for bismuth telluride having lower melting point (585° C.) to be oxidized. This phenomenon similarly occurs in FIG. 2, and even in the case in which the tellurium alloy compound and glass are mixed, the order in which mass starts to increase is a mixture containing bismuth telluride followed by mixtures of lead telluride, zinc telluride, and silver telluride. Therefore, in the case that glass is mixed, in comparison to bismuth telluride having a lower melting point, lead telluride, zinc telluride, and silver telluride having a high melting point still have the characteristic of not readily oxidized. Based on the aforementioned TGA result, the conductive paste of the invention contains the aforementioned high-melting point tellurium alloy compound and can inhibit the occurrence of glass fire-through to control the degree of fire-through, so as to improve electrical connection and increase cell efficiency.

<Glass>

In the present embodiment, the material of the glass can include tellurium oxide, bismuth oxide, zinc oxide, lead oxide, silicon oxide, or a combination thereof. However, the invention is not limited thereto, and the material of the glass can also contain one or a plurality of the elements in the group consisting of the following or oxides thereof: phosphorous (P), boron (B), barium (Ba), sodium (Na), magnesium (Mg), zinc (Zn), calcium (Ca), copper (Cu), strontium (Sr), tungsten (W), aluminum (Al), lithium (Li), potassium (K), zirconium (Zr), vanadium (V), selenium (Se), iron (Fe), indium (In), manganese (Mn), tin (Sn), nickel (Ni), antimony (Sb), silver (Ag), silicon (Si), erbium (Er), germanium (Ge), titanium (Ti), thallium (Tl), gallium (Ga), cerium (Ce), niobium (Nb), samarium (Sm), and lanthanum (La).

More specifically, based on the total weight of the conductive paste for a solar cell, the total amount of the glass and the tellurium alloy compound is, for instance, 0.02 wt % to 12 wt %, preferably is, for instance, 0.02 wt % to 10 wt %, the amount of the glass is, for instance, 0.01 wt % to 7 wt %, and the amount of the tellurium alloy compound is, for instance, 0.01 wt % to 5 wt %.

For instance, when the material of the glass includes lead oxide and bismuth oxide, based on the total weight of the conductive paste for a solar cell, the amount of the glass is, for instance, 0.01 wt % to 2 wt %, and the amount of the tellurium alloy compound is, for instance, 0.5 wt % to 3 wt %. When the material of the glass includes tellurium oxide, bismuth oxide, and zinc oxide, based on the total weight of the conductive paste for a solar cell, the amount of the glass is, for instance, 0.01 wt % to 5 wt %, and the amount of the tellurium alloy compound is, for instance, 0.01 wt % to 3.5 wt %. Alternatively, when the material of the glass includes lead oxide and tellurium oxide, based on the total weight of the conductive paste for a solar cell, the amount of the glass is, for instance, 0.01 wt % to 6 wt %, and the amount of the tellurium alloy compound is, for instance, 0.25 wt % to 4 wt %. Alternatively, when the material of the glass includes bismuth oxide, tellurium oxide, and silicon oxide, based on the total weight of the conductive paste for a solar cell, the amount of the glass is, for instance, 0.01 wt % to 3 wt %, and the amount of the tellurium alloy compound is, for instance, 0.25 wt % to 3.5 wt %.

<Silver Powder>

In the present embodiment, based on the total weight of the conductive paste for a solar cell, the amount of the silver powder is, for instance, 60 wt % to 95 wt %, and the particle size of the silver powder is, for instance, 0.05 μm to 10 μm. The shape of the particle may include flaky, spherical, columnar, blocky, or unspecified shapes that fit the size.

<Organic Vehicle>

In the present embodiment, the organic vehicle can include a solvent, an adhesive, and an additive, and the organic vehicle can be removed during the sintering process performed on the conductive paste. Based on the total weight of the conductive paste for a solar cell, the amount of the organic vehicle is, for instance, 5 wt % to 40 wt %. More specifically, the function of the solvent is to dissolve the adhesive to provide viscosity, and can include diethylene glycol monobutyl ether, diethylene glycol monobutyl ether, Texanol, α-terpineol, or a combination thereof. The function of the adhesive is to provide viscosity in the solvent and can include ethylcellulose, methylcellulose, hydroxypropylcellulose, cellulose acetate, nitrocellulose, or a combination thereof. The function of the additive is to improve the properties of the conductive paste, and examples thereof can be, but not limited to, a co-initiator, sensitizing agent, coupling agent, dispersant, moisturizing agent, thickener, defoamer, or thixotropic agent; or examples thereof can also be, but not limited to, zirconium oxide ($ZrO_2$), vanadium pentoxide ($V_2O_5$), silver oxide ($Ag_2O$), erbium oxide ($Er_2O_3$), tin oxide (SnO), magnesium oxide (MgO), neodymium oxide ($Nd_2O_3$), selenium dioxide ($SeO_2$), lead oxide (PbO), chrome trioxide ($Cr_2O_3$), potassium oxide (K$_2$O), phosphorus pentoxide (P$_2$O$_5$), manganese dioxide (MnO$_2$), nickel oxide (NiO), samarium trioxide (Sm$_2$O$_3$), germanium dioxide (GeO$_2$), zinc fluoride (ZnF$_2$), indium trioxide (In$_2$O$_3$), or gallium oxide (Ga$_2$O$_3$).

In the following, the conductive paste for a solar cell provided in the invention is described in detail via an experimental example. However, the following experimental example is not intended to limit the invention.

Experimental Examples

To prove that the conductive paste of the invention can improve electrical connection and increase cell efficiency, the following experimental examples are provided.

Preparation of Conductive Paste and Solar Cell Performance Evaluation

The conductive paste for a solar cell was prepared based on the amount of each component listed in Table 1 to Table 5 below, and the solar cell performance thereof was measured, including fill-factor (FF) and conversion efficiency (NCell). In Table 1 to Table 5, the amount of the tellurium alloy compound and the glass is based on the total weight of the conductive paste and is in units of weight percentage.

In the preparation method, about 60 g to about 90 g of a silver powder, about 0.01 g to about 7 g of a glass, about 5 g to about 40 g of an organic vehicle, and about 0.01 g to about 5 g of a tellurium alloy compound were uniformly mixed and dispersed in a three-roll mill to form a conductive paste. The conductive paste was printed on the front of a solar cell substrate via screen printing, wherein the surface of the solar cell substrate was pre-treated by an anti-reflective printing (silicon nitride), and the back electrode of the solar cell substrate was pre-treated with aluminum adhesive. After screen printing, the drying temperature was about 100° C. to about 400° C., and the drying time was about 5 seconds to about 30 minutes (different based on the type of the organic vehicle and printing weight). The screen printing step was complete at this point. A fire-through step was performed on the conductive paste after drying using an infrared conveyor belt sintering furnace, and the sintering temperature was set to about 800° C. to about 980° C. Solid electrodes were formed on both the front and back of the solar cell substrate after fire-through.

The measurement method of solar cell performance included placing the solar cell on a solar test machine (Berger Corporation, Pulsed Solar Load PSL-SCD) and measuring electrical characteristics such as fill-factor (FF, unit %) and conversion efficiency (NCell, unit %) of the solar cell at a solar state of AM1.5G.

In Table 1, a glass A mainly contained tellurium oxide, bismuth oxide, and zinc oxide and had a softening point of 365° C., and the conductive paste made by the glass A was printed on a monocrystalline substrate to form a solar cell. As shown in Table 1, in comparison to Example 1 to Example 12 in which a high-melting point tellurium alloy compound (such as lead telluride, zinc telluride, or silver telluride) was used, Comparative example 1 in which a low-melting point bismuth telluride was used has significantly lower conversion efficiency NCell.

TABLE 1

| | Glass A (wt %) | Tellurium alloy compound (wt %) | | FF | NCell |
|---|---|---|---|---|---|
| Example 1 | 4.5 | Lead | 0.02 | 55.0 | 13.13% |
| Example 2 | 3.8 | telluride | 0.05 | 68.6 | 16.91% |
| Example 3 | 2.6 | | 0.1 | 78.4 | 19.19% |
| Example 4 | 2 | | 0.5 | 79.2 | 19.58% |

TABLE 1-continued

| | Glass A (wt %) | Tellurium alloy compound (wt %) | | FF | NCell |
|---|---|---|---|---|---|
| Example 5 | 0.1 | | 2.6 | 72.0 | 17.63% |
| Example 6 | 0.1 | | 2.96 | 56.0 | 13.55% |
| Example 7 | 2.6 | Zinc | 0.1 | 78.2 | 13.13% |
| Example 8 | 2 | telluride | 0.5 | 78.1 | 16.91% |
| Example 9 | 1.6 | | 1.1 | 76.7 | 19.19% |
| Example 10 | 1.1 | | 1.6 | 66.4 | 19.58% |
| Example 11 | 2.6 | Silver | 0.1 | 78.5 | 19.33% |
| Example 12 | 2 | telluride | 0.5 | 55.3 | 13.53% |
| Comparative example 1 | 0.8 | Bismuth telluride | 1.8 | 42.2 | 9.83% |

In Table 2, a glass B mainly contained lead oxide and tellurium oxide and had a softening point of 317° C., and the conductive paste made by the glass B was printed on a monocrystalline substrate to form a solar cell. As shown in Table 2, in comparison to Example 13 to Example 21 in which a high-melting point tellurium alloy compound (such as lead telluride, zinc telluride, or silver telluride) was used, Comparative example 2 in which a low-melting point bismuth telluride was used has significantly lower conversion efficiency NCell.

TABLE 2

| | Glass B (wt %) | Tellurium alloy compound (wt %) | | FF | NCell |
|---|---|---|---|---|---|
| Example 13 | 2 | Silver | 0.5 | 79.2 | 19.75% |
| Example 14 | 1.6 | telluride | 0.9 | 77.6 | 19.16% |
| Example 15 | 1.4 | | 1.1 | 75.1 | 18.57% |
| Example 16 | 1.2 | | 1.3 | 64.5 | 15.61% |
| Example 17 | 5 | Lead | 0.1 | 70.3 | 17.01% |
| Example 18 | 2 | telluride | 0.5 | 79.0 | 19.72% |
| Example 19 | 0.1 | | 3.5 | 62.2 | 15.03% |
| Example 20 | 2 | Zinc | 0.5 | 62.4 | 15.45% |
| Example 21 | 1.5 | telluride | 1 | 57 | 13.93% |
| Comparative example 2 | 0.6 | Bismuth telluride | 1.9 | 21.6 | 2.73% |

In Table 3, a glass C mainly contained bismuth oxide, tellurium oxide, and silicon oxide and had a softening point of 465° C., and the conductive paste made by the glass C was printed on a monocrystalline substrate to form a solar cell. As shown in Table 3, in comparison to Example 22 to Example 31 in which a high-melting point tellurium alloy compound (such as lead telluride or silver telluride) was used, Comparative example 3 in which a low-melting point bismuth telluride was used has significantly lower conversion efficiency NCell.

TABLE 3

| | Glass C (wt %) | Tellurium alloy compound (wt %) | | FF | NCell |
|---|---|---|---|---|---|
| Example 22 | 2.5 | Lead | 0.5 | 60.2 | 14.36% |
| Example 23 | 1.45 | telluride | 1.05 | 80 | 19.15% |
| Example 24 | 2.04 | | 1.06 | 64.7 | 15.76% |
| Example 25 | 0.7 | | 1.3 | 79 | 19.54% |
| Example 26 | 1.2 | | 1.3 | 79.6 | 19.39% |
| Example 27 | 0.7 | | 1.55 | 80.7 | 19.32% |
| Example 28 | 0.95 | | 1.55 | 79.6 | 19.39% |
| Example 29 | 0.7 | | 1.8 | 79.6 | 19.41% |
| Example 30 | 0.1 | | 3 | 72.5 | 18.2% |
| Example 31 | 2 | Silver telluride | 0.5 | 51.5 | 12.87% |

TABLE 3-continued

|  | Glass C (wt %) | Tellurium alloy compound (wt %) | | FF | NCell |
|---|---|---|---|---|---|
| Comparative example 3 | 0.7 | Bismuth telluride | 1.3 | 25.4 | 4.13% |

In Table 4, a glass D mainly contained lead oxide and bismuth oxide and had a softening point of 440° C., and the conductive paste made by the glass D was printed on a monocrystalline substrate to form a solar cell. As shown in Table 4, in comparison to Example 32 to Example 35 in which a high-melting point tellurium alloy compound (such as lead telluride or silver telluride) was used, Comparative example 4 in which a low-melting point bismuth telluride was used has significantly lower conversion efficiency NCell.

TABLE 4

|  | Glass D (wt %) | Tellurium alloy compound (wt %) | | FF | NCell |
|---|---|---|---|---|---|
| Example 32 | 1.8 | Lead telluride | 0.75 | 47.6 | 11.08% |
| Example 33 | 0.1 |  | 2.5 | 78.3 | 19.01% |
| Example 34 | 1.5 | Silver telluride | 1 | 61.4 | 14.65% |
| Example 35 | 0.5 |  | 2 | 49.3 | 11.9% |
| Comparative example 4 | 1.5 | Bismuth telluride | 1 | 35.9 | 7.89% |

In Table 5, the conductive paste made by a glass D was printed on a polycrystalline substrate to form a solar cell. As shown in Table 5, in comparison to Example 36 to Example 40 in which a high-melting point tellurium alloy compound (such as lead telluride, zinc telluride, or silver telluride) was used, Comparative example 5 in which a low-melting point bismuth telluride was used has significantly lower conversion efficiency NCell.

TABLE 5

|  | Glass D (wt %) | Tellurium alloy compound (wt %) | | FF | NCell |
|---|---|---|---|---|---|
| Example 36 | 0.5 | Lead telluride | 1.5 | 76.74 | 17.2% |
| Example 37 | 1.0 |  | 1.5 | 73.59 | 16.34% |
| Example 38 | 1.5 |  | 1.5 | 70.31 | 15.45% |
| Example 39 | 1.5 | Silver telluride | 1.5 | 49.3 | 15.03% |
| Example 40 | 1.5 | Zinc telluride | 1.5 | 61.74 | 13.72% |
| Comparative example 5 | 1.5 | Bismuth telluride | 1.25 | 35.73 | 6.87% |

Based on the experimental results of Table 1 to Table 5 above, when the conductive paste contains a low-melting point tellurium alloy compound, regardless of whether a monocrystalline or polycrystalline substrate is used, molten glass fire through earlier, such that the PN junction is fired through and cell efficiency is reduced as a result. In comparison, when the conductive paste contains a high-melting point tellurium alloy compound having a melting point of 900° C. or more, fire-through of the glass can be inhibited to control the degree of fire-through. Therefore, the electrical connection of the solar cell can be improved and cell efficiency can be increased.

Based on the above, the invention provides a conductive paste for a solar cell that can be used to form a positive electrode of the solar cell and contains a high-melting point tellurium alloy compound having a melting point (such as 900° C. or more) at least 300° C. higher than the softening point of glass. Therefore, fire-through of the glass can be inhibited to control the degree of fire-through, so as to improve electrical connection and increase cell efficiency. As a result, the issue of reduced cell efficiency caused by excessive fire-through of molten glass in the prior art can be solved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A conductive paste for a solar cell, comprising:
    a silver powder;
    a glass;
    an organic vehicle; and
    a tellurium alloy compound, wherein the tellurium alloy compound has a melting point at least 300° C. higher than a softening point of the glass, and the melting point of the tellurium alloy compound is 900° C. or more, the tellurium alloy compound is not zinc telluride,
    wherein a material of the glass comprises lead oxide and bismuth oxide, and based on a total weight of the conductive paste for the solar cell, an amount of the tellurium alloy compound is 0.5 wt % to 3 wt %.

2. The conductive paste for the solar cell of claim 1, wherein the tellurium alloy compound comprises lead telluride, silver telluride, or a combination thereof.

3. The conductive paste for the solar cell of claim 1, wherein based on the total weight of the conductive paste for the solar cell, an amount of the glass is 0.01 wt % to 7 wt %.

4. A solar cell comprising an electrode made by the conductive paste for the solar cell of claim 1.

5. A manufacturing method of a solar cell, wherein the conductive paste for the solar cell of claim 1 is used to form an electrode of the solar cell.

6. A solar cell module comprising the solar cell of claim 4 or the solar cell made by the manufacturing method of the solar cell of claim 5.

* * * * *